(12) United States Patent
Connell et al.

(10) Patent No.: US 7,727,785 B2
(45) Date of Patent: Jun. 1, 2010

(54) WAFER BACK SIDE COATING TO BALANCE STRESS FROM PASSIVATION LAYER ON FRONT OF WAFER AND BE USED AS DIE ATTACH ADHESIVE

(75) Inventors: Michael E. Connell, Boise, ID (US); Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 354 days.

(21) Appl. No.: 11/269,069

(22) Filed: Nov. 7, 2005

(65) Prior Publication Data

US 2006/0051938 A1 Mar. 9, 2006

Related U.S. Application Data

(63) Continuation of application No. 10/082,372, filed on Feb. 25, 2002, now Pat. No. 7,169,685.

(51) Int. Cl.
*H01L 21/00* (2006.01)
(52) U.S. Cl. .......................................................... 438/24
(58) Field of Classification Search ............. 438/14–16, 438/21, 113, 200, 243, 613, 622, 597, 584, 438/459–460, 462; 257/48, 632, 620–621, 257/787, 737, 734, 669, 678; 356/600, 237.2
See application file for complete search history.

(56) References Cited

U.S. PATENT DOCUMENTS

| 2,357,600 | A | 9/1944 | Pabst |
| 2,413,767 | A | 1/1947 | Hyde |
| 2,454,548 | A | 11/1948 | Brinkert |
| 2,495,541 | A | 1/1950 | Nolan, Jr. |
| 3,239,218 | A | 3/1966 | Reeves |
| 3,254,776 | A | 6/1966 | Brown |
| 3,327,889 | A | 6/1967 | Dore |
| 3,625,384 | A | 12/1971 | Boerger et al. |
| 3,628,672 | A | 12/1971 | Heinz |
| 3,751,587 | A | 8/1973 | Insler et al. |

(Continued)

FOREIGN PATENT DOCUMENTS

CA  843232  6/1970

(Continued)

OTHER PUBLICATIONS

Popov, E.P., "Mechanics of Materials," 1952, Prentice-Hall, Inc., p. 35.

(Continued)

*Primary Examiner*—Charles D Garber
*Assistant Examiner*—Andre' C Stevenson
(74) *Attorney, Agent, or Firm*—TraskBritt

(57) ABSTRACT

A method for balancing layer-caused compressive or tensile stress in a semiconductor die, die wafer or similar substrate uses a stress-balancing layer (SBL) attached to an opposite side from a stress-causing layer before the semiconductor die or wafer is significantly warped are provided. The SBL may also serve as, or support, an adhesive layer for die attach and be of a markable material for an enhanced marking method.

23 Claims, 5 Drawing Sheets

U.S. PATENT DOCUMENTS

| | | |
|---|---|---|
| 3,774,352 A | 11/1973 | Weber |
| 3,799,017 A | 3/1974 | Halligan |
| 3,837,510 A | 9/1974 | McWilliams |
| 3,861,969 A | 1/1975 | Ono et al. |
| 3,887,997 A | 6/1975 | Hartleroad et al. |
| 3,903,934 A | 9/1975 | Vizy |
| 3,917,983 A | 11/1975 | Kuronen |
| 3,937,386 A | 2/1976 | Hartleroad et al. |
| 3,969,813 A | 7/1976 | Minetti et al. |
| 3,973,665 A | 8/1976 | Giammanco |
| 4,024,545 A | 5/1977 | Dowling et al. |
| 4,027,246 A | 5/1977 | Caccoma et al. |
| 4,030,622 A | 6/1977 | Brooks et al. |
| 4,058,217 A | 11/1977 | Vaughn et al. |
| 4,095,095 A | 6/1978 | Mursoka et al. |
| 4,097,715 A | 6/1978 | Frizzi |
| 4,123,044 A | 10/1978 | Petzi |
| 4,148,057 A | 4/1979 | Jesse |
| 4,178,531 A | 12/1979 | Alig |
| 4,203,486 A | 5/1980 | Rubbright et al. |
| 4,285,433 A | 8/1981 | Garrett, Sr. et al. |
| 4,323,755 A | 4/1982 | Nierenberg |
| 4,346,284 A | 8/1982 | Grollimund et al. |
| 4,352,617 A | 10/1982 | Sakai et al. |
| 4,353,796 A | 10/1982 | Kubo et al. |
| 4,354,770 A | 10/1982 | Block |
| 4,370,542 A | 1/1983 | Mills et al. |
| 4,375,025 A | 2/1983 | Carlson |
| 4,382,580 A | 5/1983 | Hellander |
| 4,403,134 A | 9/1983 | Klingel |
| 4,454,413 A | 6/1984 | Morton, Jr. |
| 4,461,073 A | 7/1984 | Harringer et al. |
| 4,493,767 A | 1/1985 | Monteyne |
| 4,510,673 A | 4/1985 | Shils et al. |
| 4,513,539 A | 4/1985 | Steinback |
| 4,517,436 A | 5/1985 | Lawrence |
| 4,523,319 A | 6/1985 | Pfost |
| 4,534,695 A | 8/1985 | Stump et al. |
| 4,539,878 A | 9/1985 | Linker et al. |
| 4,543,716 A | 10/1985 | Damiano et al. |
| 4,552,271 A | 11/1985 | Kranz |
| 4,561,541 A | 12/1985 | Lawrence |
| 4,577,563 A | 3/1986 | Sidler |
| 4,585,931 A | 4/1986 | Duncan et al. |
| 4,594,263 A | 6/1986 | Folk et al. |
| 4,607,744 A | 8/1986 | Pak |
| 4,610,359 A | 9/1986 | Muller |
| 4,616,414 A | 10/1986 | Cushman |
| 4,626,656 A | 12/1986 | Ootsuka et al. |
| 4,630,513 A | 12/1986 | Keller |
| 4,638,144 A | 1/1987 | Latta, Jr. |
| D288,273 S | 2/1987 | Gould |
| 4,644,126 A | 2/1987 | Schumacher |
| 4,654,290 A | 3/1987 | Spanjer |
| 4,660,282 A | 4/1987 | Pfaff |
| 4,665,298 A | 5/1987 | La Rocca |
| 4,677,370 A | 6/1987 | Tustaniwskyj et al. |
| 4,696,096 A | 9/1987 | Green et al. |
| 4,702,788 A | 10/1987 | Okui |
| 4,707,722 A | 11/1987 | Folk et al. |
| 4,711,334 A | 12/1987 | Barry et al. |
| 4,718,531 A | 1/1988 | Bianchi et al. |
| 4,719,502 A | 1/1988 | Ikeya et al. |
| 4,720,317 A | 1/1988 | Kuroda et al. |
| 4,749,631 A | 6/1988 | Haluska et al. |
| 4,753,863 A | 6/1988 | Spanjer |
| 4,756,977 A | 7/1988 | Haluska et al. |
| 4,759,675 A | 7/1988 | Bond et al. |
| 4,767,984 A | 8/1988 | Bakker |
| 4,769,345 A | 9/1988 | Butt et al. |
| 4,772,079 A | 9/1988 | Douglas et al. |
| 4,778,326 A | 10/1988 | Althouse et al. |
| 4,790,515 A | 12/1988 | Pocci |
| 4,791,267 A | 12/1988 | Yokoyama et al. |
| 4,818,835 A | 4/1989 | Kuwabara et al. |
| 4,821,151 A | 4/1989 | Pryor et al. |
| 4,832,612 A | 5/1989 | Grabbe et al. |
| 4,850,780 A | 7/1989 | Safabakjsh et al. |
| 4,861,620 A | 8/1989 | Azuma et al. |
| 4,884,420 A | 12/1989 | Finkel et al. |
| 4,891,242 A | 1/1990 | Ito et al. |
| 4,914,269 A | 4/1990 | Kinsman et al. |
| 4,915,565 A | 4/1990 | Bond et al. |
| 4,916,293 A | 4/1990 | Cartlidge et al. |
| 4,926,677 A | 5/1990 | Waldner |
| 4,944,492 A | 7/1990 | Nonaka |
| 4,945,204 A | 7/1990 | Nakamura et al. |
| 4,947,981 A | 8/1990 | Dorner et al. |
| 4,965,927 A | 10/1990 | Holzman |
| 4,967,260 A | 10/1990 | Butt |
| 4,990,051 A | 2/1991 | Safabakkah et al. |
| 5,003,251 A | 3/1991 | Fuoco |
| H906 H | 4/1991 | Baggett et al. |
| 5,014,159 A | 5/1991 | Butt |
| 5,018,938 A | 5/1991 | Sikorski |
| 5,020,959 A | 6/1991 | Soth |
| 5,030,551 A | 7/1991 | Herren et al. |
| 5,043,657 A | 8/1991 | Amazeen et al. |
| 5,090,664 A | 2/1992 | McCullough et al. |
| 5,102,291 A | 4/1992 | Hine |
| 5,113,992 A | 5/1992 | Sadamori |
| 5,117,963 A | 6/1992 | Thayer et al. |
| 5,118,369 A | 6/1992 | Shamir |
| 5,127,837 A | 7/1992 | Shah et al. |
| 5,128,737 A | 7/1992 | van der Have |
| 5,148,969 A | 9/1992 | Boucher et al. |
| 5,150,797 A | 9/1992 | Shibata |
| 5,153,034 A | 10/1992 | Telchuk et al. |
| 5,157,412 A | 10/1992 | Kleinschmidt et al. |
| 5,158,818 A | 10/1992 | Aurichio |
| 5,175,774 A | 12/1992 | Truax et al. |
| 5,177,368 A | 1/1993 | Kay |
| 5,183,783 A | 2/1993 | Ohta et al. |
| 5,197,650 A | 3/1993 | Monzen et al. |
| 5,203,143 A | 4/1993 | Gutentag |
| 5,204,987 A | 4/1993 | Klingel |
| 5,206,280 A | 4/1993 | Williams |
| 5,218,894 A | 6/1993 | College et al. |
| 5,219,765 A | 6/1993 | Yoshida et al. |
| 5,220,754 A | 6/1993 | Tayebi et al. |
| 5,226,361 A | 7/1993 | Grant et al. |
| 5,245,166 A | 9/1993 | Shepard |
| 5,245,900 A | 9/1993 | Dojnik |
| 5,256,578 A | 10/1993 | Corley et al. |
| 5,260,542 A | 11/1993 | Ishiguro et al. |
| 5,262,470 A | 11/1993 | Shimotsuma et al. |
| 5,263,567 A | 11/1993 | Costa |
| 5,268,059 A | 12/1993 | Olson |
| 5,278,442 A | 1/1994 | Prinz et al. |
| 5,279,975 A | 1/1994 | Devereaux et al. |
| 5,289,113 A | 2/1994 | Meaney et al. |
| 5,290,134 A | 3/1994 | Baba |
| 5,294,812 A | 3/1994 | Hashimoto et al. |
| 5,295,778 A | 3/1994 | Hirai et al. |
| 5,299,902 A | 4/1994 | Fujiwara et al. |
| 5,300,172 A | 4/1994 | Ishiwata et al. |
| 5,301,143 A | 4/1994 | Ohri et al. |
| 5,302,798 A | 4/1994 | Inagawa et al. |
| 5,307,010 A | 4/1994 | Chiu |
| 5,313,156 A | 5/1994 | Klug et al. |
| 5,315,094 A | 5/1994 | Lisy |
| 5,322,173 A | 6/1994 | Kay |
| 5,323,051 A | 6/1994 | Adams |
| 5,329,090 A | 7/1994 | Woelki et al. |

| | | | | | | |
|---|---|---|---|---|---|---|
| 5,332,463 A | 7/1994 | Eberlein et al. | | 5,793,051 A | 8/1998 | Stern et al. |
| 5,335,458 A | 8/1994 | Stoffers et al. | | 5,801,067 A | 9/1998 | Shaw et al. |
| 5,336,928 A | 8/1994 | Neugebauer et al. | | 5,801,084 A | 9/1998 | Beasom et al. |
| 5,346,802 A | 9/1994 | Ohbachi et al. | | 5,805,472 A | 9/1998 | Fukasawa |
| 5,357,077 A | 10/1994 | Tsuruta | | 5,808,268 A | 9/1998 | Balz et al. |
| 5,360,747 A | 11/1994 | Larson et al. | | 5,821,497 A | 10/1998 | Yamazaki et al. |
| 5,365,653 A | 11/1994 | Padrun | | 5,827,771 A | 10/1998 | Ginn et al. |
| 5,373,039 A | 12/1994 | Sakai et al. | | 5,829,115 A | 11/1998 | Speller, Jr. et al. |
| 5,375,320 A | 12/1994 | Kinsman et al. | | 5,834,363 A * | 11/1998 | Masanori .................... 438/507 |
| 5,379,514 A | 1/1995 | Okuda et al. | | 5,838,361 A | 11/1998 | Corbett |
| 5,399,828 A | 3/1995 | Riddle et al. | | 5,838,431 A | 11/1998 | Hara et al. |
| 5,402,563 A | 4/1995 | Satoh et al. | | 5,840,614 A | 11/1998 | Sim et al. |
| 5,413,629 A | 5/1995 | Yasui et al. | | 5,844,803 A | 12/1998 | Beffa |
| 5,415,939 A | 5/1995 | Yeung | | 5,855,969 A | 1/1999 | Robertson |
| 5,417,408 A | 5/1995 | Ueda | | 5,856,230 A | 1/1999 | Jang |
| 5,423,716 A | 6/1995 | Strasbaugh | | 5,856,923 A | 1/1999 | Jones et al. |
| 5,423,931 A | 6/1995 | Inoue et al. | | 5,866,644 A | 2/1999 | Mercx et al. |
| 5,427,349 A | 6/1995 | Obrecht | | 5,870,820 A | 2/1999 | Arakawa et al. |
| 5,445,923 A | 8/1995 | Takahashi et al. | | 5,875,544 A | 3/1999 | Chou |
| 5,448,488 A | 9/1995 | Oshima | | 5,893,760 A | 4/1999 | Mikata et al. |
| 5,454,900 A | 10/1995 | Han et al. | | 5,903,044 A | 5/1999 | Farnworth et al. |
| 5,455,459 A | 10/1995 | Fillion et al. | | 5,907,492 A | 5/1999 | Akram et al. |
| 5,458,158 A | 10/1995 | Kawanabe | | 5,909,706 A | 6/1999 | Jin et al. |
| 5,463,227 A | 10/1995 | Stern et al. | | 5,911,461 A | 6/1999 | Sauter et al. |
| 5,465,470 A | 11/1995 | Vongfuangfoo et al. | | 5,915,231 A | 6/1999 | Beffa |
| 5,466,908 A | 11/1995 | Hosoya et al. | | 5,927,512 A | 7/1999 | Beffa |
| 5,467,023 A | 11/1995 | Takeyama | | 5,928,842 A | 7/1999 | Shinmoto et al. |
| 5,479,694 A | 1/1996 | Baldwin | | 5,932,119 A | 8/1999 | Kaplan et al. |
| 5,481,135 A | 1/1996 | Chandra et al. | | 5,937,270 A | 8/1999 | Canella |
| 5,481,202 A | 1/1996 | Frye, Jr. | | 5,942,136 A | 8/1999 | Mori et al. |
| 5,484,314 A | 1/1996 | Farnworth | | 5,946,791 A | 9/1999 | Baldwin |
| 5,487,471 A | 1/1996 | Marchek et al. | | 5,962,097 A | 10/1999 | Yamamoto et al. |
| 5,496,432 A | 3/1996 | Sumi et al. | | 5,966,307 A | 10/1999 | Lin |
| 5,497,033 A | 3/1996 | Fillion et al. | | 5,972,234 A | 10/1999 | Weng et al. |
| 5,498,851 A | 3/1996 | Hayashi et al. | | 5,976,955 A | 11/1999 | Hodges |
| D371,021 S | 6/1996 | Pine et al. | | 5,985,377 A | 11/1999 | Corbett |
| 5,534,094 A | 7/1996 | Arjavalingam et al. | | 5,985,510 A | 11/1999 | Akutsu et al. |
| 5,545,367 A | 8/1996 | Bae et al. | | 5,986,235 A | 11/1999 | Canella |
| 5,547,906 A | 8/1996 | Badehi | | 5,991,245 A | 11/1999 | Yohimura |
| 5,551,959 A | 9/1996 | Martin et al. | | 5,999,252 A | 12/1999 | Greisz |
| 5,566,414 A | 10/1996 | Nonaka | | 6,008,070 A | 12/1999 | Farworth |
| 5,566,840 A | 10/1996 | Waldner et al. | | 6,008,476 A | 12/1999 | Neiconi et al. |
| 5,587,094 A | 12/1996 | Yoshida et al. | | 6,011,315 A | 1/2000 | Toyosawa et al. |
| 5,588,797 A | 12/1996 | Smith | | 6,023,042 A | 2/2000 | Hensel et al. |
| 5,590,787 A | 1/1997 | Hodges | | 6,028,134 A | 2/2000 | Zhang et al. |
| 5,600,150 A | 2/1997 | Stern et al. | | 6,030,485 A | 2/2000 | Yamada |
| 5,600,181 A | 2/1997 | Scott et al. | | 6,062,119 A | 5/2000 | Overgaard |
| 5,605,641 A | 2/1997 | Chiba et al. | | 6,070,731 A | 6/2000 | Kobayashi et al. |
| 5,629,484 A | 5/1997 | Liska | | 6,084,288 A | 7/2000 | Farnworth et al. |
| 5,632,083 A | 5/1997 | Tada et al. | | 6,100,486 A | 8/2000 | Beffa |
| 5,632,915 A | 5/1997 | Schnetzer et al. | | 6,108,026 A | 8/2000 | Corbett |
| 5,635,766 A | 6/1997 | Cain | | 6,113,992 A | 9/2000 | Corbett |
| 5,638,958 A | 6/1997 | Sanchez | | 6,122,563 A | 9/2000 | Beffa |
| 5,643,477 A | 7/1997 | Gullo et al. | | 6,137,125 A | 10/2000 | Costas et al. |
| 5,648,136 A | 7/1997 | Bird | | 6,138,542 A | 10/2000 | Overgaard |
| 5,648,436 A | 7/1997 | Janowitz et al. | | 6,153,034 A | 11/2000 | Lipsker |
| 5,653,900 A | 8/1997 | Clement et al. | | 6,154,366 A | 11/2000 | Ma et al. |
| 5,654,204 A | 8/1997 | Anderson | | 6,188,129 B1 | 2/2001 | Paik et al. |
| 5,656,548 A | 8/1997 | Zavracky et al. | | 6,202,292 B1 | 3/2001 | Farnworth et al. |
| 5,663,096 A | 9/1997 | Okabe et al. | | 6,229,323 B1 | 5/2001 | Tverdy et al. |
| 5,665,609 A | 9/1997 | Mori | | 6,244,569 B1 | 6/2001 | Canella et al. |
| 5,682,065 A | 10/1997 | Farnworth et al. | | 6,244,634 B1 | 6/2001 | Robinson |
| 5,691,544 A | 11/1997 | Stern et al. | | 6,277,725 B1 | 8/2001 | Hsiao |
| 5,692,873 A | 12/1997 | Weeks et al. | | 6,287,068 B1 | 9/2001 | Canella et al. |
| 5,701,084 A | 12/1997 | Bothwick, Jr. et al. | | 6,303,471 B1 | 10/2001 | Unno et al. |
| 5,715,592 A | 2/1998 | Mori et al. | | 6,323,060 B1 | 11/2001 | Isaak |
| 5,717,162 A | 2/1998 | Matsuoka | | 6,352,803 B1 | 3/2002 | Tong et al. |
| 5,719,372 A | 2/1998 | Togari et al. | | 6,380,558 B1 | 4/2002 | Yamazaki et al. |
| 5,722,639 A | 3/1998 | Nonaka | | 6,444,490 B2 | 9/2002 | Bertin et al. |
| 5,728,624 A | 3/1998 | Linn et al. | | 6,489,178 B2 | 12/2002 | Coyle et al. |
| 5,761,301 A | 6/1998 | Oshima et al. | | 6,524,881 B1 | 2/2003 | Tandy et al. |
| 5,765,277 A | 6/1998 | Jin et al. | | 6,579,748 B1 | 6/2003 | Okuno et al. |
| 5,780,311 A | 7/1998 | Beasom et al. | | 6,585,927 B2 | 7/2003 | Grigg et al. |

| | | |
|---|---|---|
| 6,603,191 B2 | 8/2003 | Wakabayashi et al. |
| 6,656,820 B2 | 12/2003 | Liu |
| 6,692,978 B2 | 2/2004 | Tandy et al. |
| 6,734,032 B2 | 5/2004 | Tandy et al. |
| 6,737,201 B2 | 5/2004 | Shoki et al. |
| 6,749,893 B2 * | 6/2004 | Ouellet et al. .............. 427/162 |
| 7,094,618 B2 | 8/2006 | Tandy et al. |
| 2002/0048906 A1 | 4/2002 | Sakai et al. |
| 2002/0064359 A1 | 5/2002 | Ouellet et al. |
| 2002/0180985 A1 * | 12/2002 | Wack et al. ................. 356/600 |
| 2003/0017626 A1 | 1/2003 | Hilt et al. |
| 2003/0017652 A1 | 1/2003 | Sakaki et al. |
| 2003/0207095 A1 | 11/2003 | Lowack et al. |
| 2004/0217453 A1 * | 11/2004 | Ogino et al. ................ 257/669 |
| 2005/0142815 A1 * | 6/2005 | Miyazaki et al. ............ 438/464 |
| 2007/0211112 A1 * | 9/2007 | Silverbrook ................. 347/54 |

FOREIGN PATENT DOCUMENTS

| | | |
|---|---|---|
| DE | 243 798 | 3/1987 |
| EP | 0 653 791 A1 | 10/1994 |
| FR | 1284603 | 1/1961 |
| JP | 57-53955 | 3/1982 |
| JP | 59132153 A | 7/1984 |
| JP | 61-297047 | 12/1986 |
| JP | 62-244591 | 10/1987 |
| JP | 63171714 | 7/1988 |
| JP | 63-202521 | 8/1988 |
| JP | 1-100677 | 4/1989 |
| JP | 2-205281 | 8/1990 |
| JP | 466416 | 3/1992 |
| JP | 5-69164 | 3/1993 |
| JP | 6-226472 | 8/1994 |
| JP | 6-326203 | 11/1994 |
| JP | 06314899 A | 11/1994 |

OTHER PUBLICATIONS

US 6,048,624, 04/2000, Alba et al. (withdrawn)

* cited by examiner

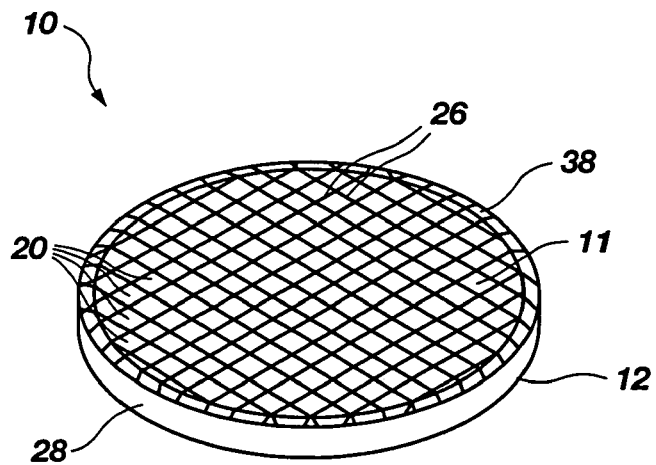
Fig. 1
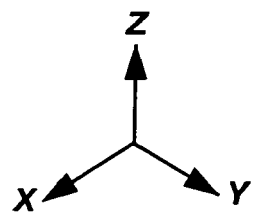
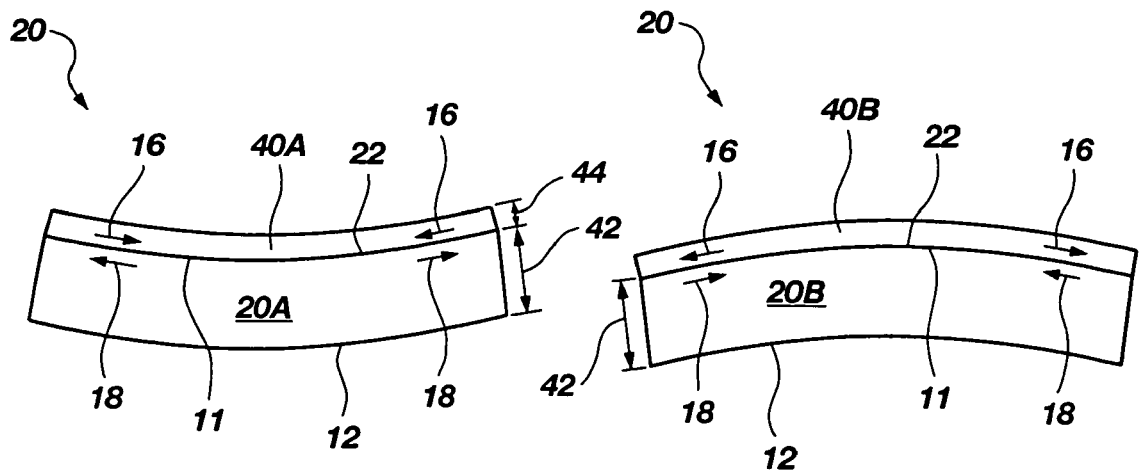
Fig. 2A
(PRIOR ART)
Fig. 2B
(PRIOR ART)

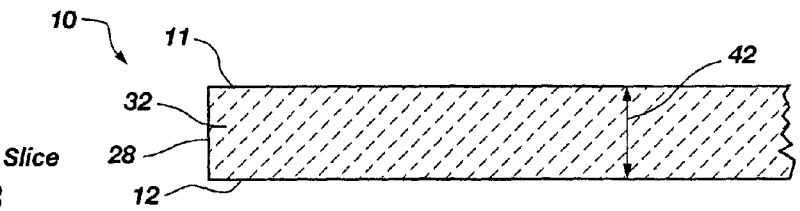
Fig. 3 Slice
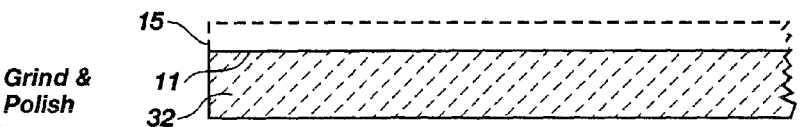
Fig. 4 Grind & Polish
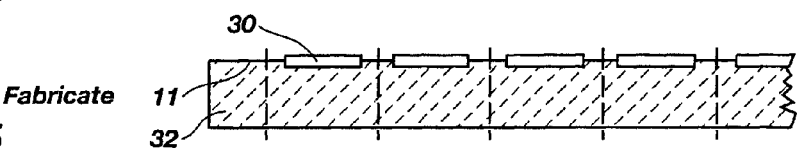
Fig. 5 Fabricate
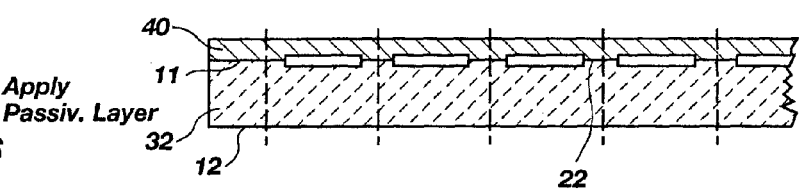
Fig. 6 Apply Passiv. Layer
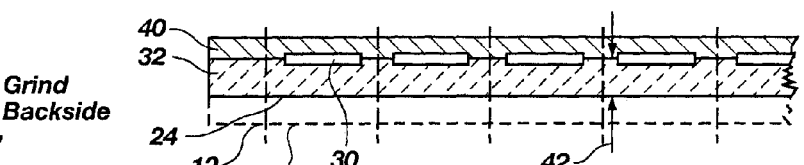
Fig. 7 Grind Backside
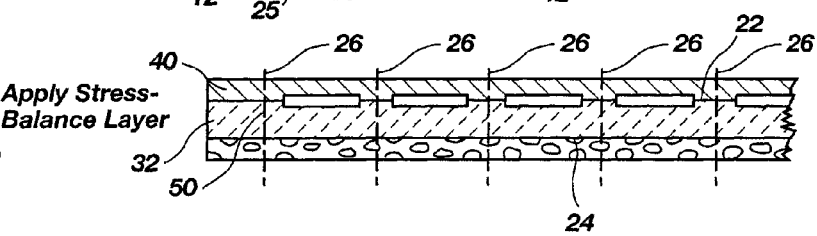
Fig. 8 Apply Stress-Balance Layer
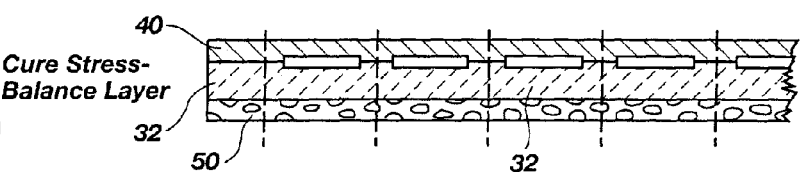
Fig. 9 Cure Stress-Balance Layer
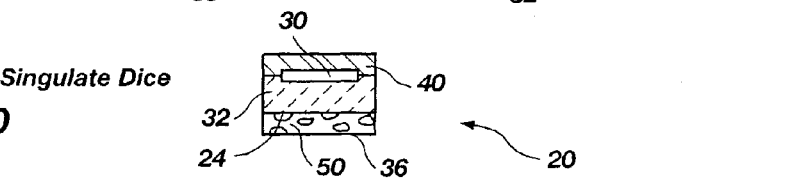
Fig. 10 Singulate Dice

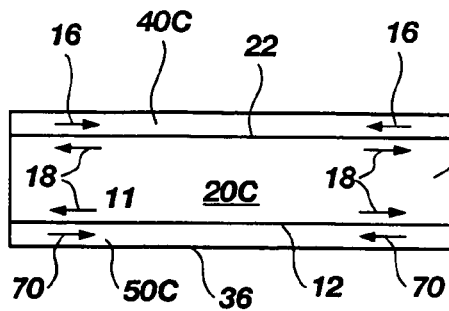
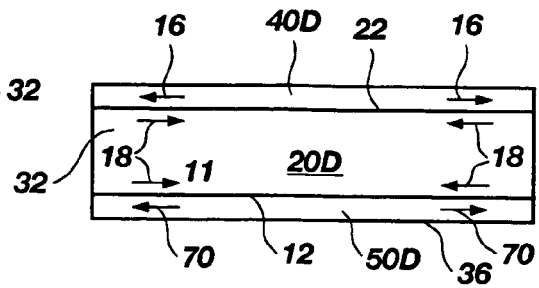
*Fig. 17A*     *Fig. 17B*
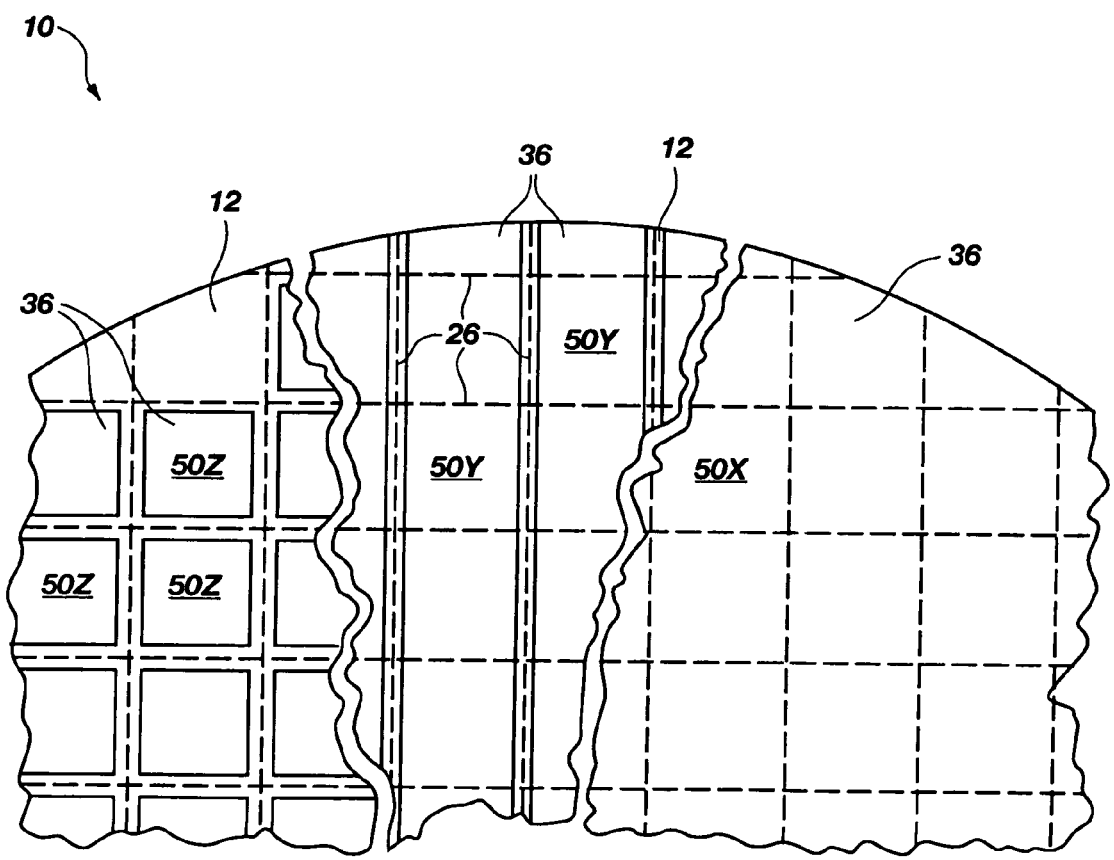
*Fig. 18*

WAFER BACK SIDE COATING TO BALANCE STRESS FROM PASSIVATION LAYER ON FRONT OF WAFER AND BE USED AS DIE ATTACH ADHESIVE

CROSS-REFERENCE TO RELATED APPLICATION

This application is a continuation of application Ser. No. 10/082,372, filed Feb. 25, 2002, now U.S. Pat. No. 7,169,685, issued Jan. 30, 2007.

BACKGROUND OF THE INVENTION

1. Field of the Invention

The present invention relates to methods for making semiconductor dice. More specifically, the invention relates to methods and apparatus for balancing stress in a semiconductor die resulting from stress within a top side protective layer.

2. State of the Art

An individual integrated circuit semiconductor die is usually formed from a larger structure known as a semiconductor wafer. Wafers are usually formed by slicing a large cylindrically shaped crystal of silicon, although other materials such as gallium arsenide and indium phosphide are also used. The front side or surface of the wafer is first ground and polished to a smooth surface, for fabrication of multiple integrated circuits thereon. Each semiconductor wafer has a plurality of integrated circuits arranged in rows and columns with the periphery of each integrated circuit typically being substantially rectangular. In the electronics industry, there is a need for apparatus of smaller size, higher performance and higher memory storage. These factors drive the industry to produce smaller semiconductor dice by thinning each wafer, i.e., reducing the cross-section using a mechanical and/or chemical grinding process or etching. After thinning, the wafer is sawn or diced into rectangularly shaped "dice" along two mutually perpendicular sets of parallel lines or streets separating each row and column of dice in the wafer. Thus, the individual integrated circuit semiconductor die in the form of semiconductor dice are singulated from the wafer.

Fabrication of the integrated circuits is performed on the active surface of the undivided wafer, and consists of various processes including known steps of layering, patterning, doping, etching and heat treatment, for example. Various layers applied to the active surface of the wafer typically include insulators, semiconductors and metallic conductors. The final layering step generally comprises the application of a passivation material to cover the integrated circuit with a smooth electrically insulative protective layer. The purpose of the passivation layer is to protect the electronic components on the active surface, i.e., front side during subsequent wafer thinning, die testing, die singulation from the wafer, die packaging, and use. Exemplary passivation materials include silicon dioxide and silicon nitride (doped or undoped with boron or phosphorus, for example), as well as other materials including polymer-based compositions as known in the art. Further protection from damage during thinning of the wafer back side may be provided by temporarily attaching an adhesive-backed polymer (e.g. vinyl) sheet to the front side of the wafer. Such is disclosed in U.S. Pat. No. 5,840,614 of Sim et al. and U.S. Pat. No. 6,030,485 of Yamada, in which a UV-sensitive tape is attached to the active surface of a wafer and made removable by radiation following back side lapping. In U.S. Pat. No. 5,962,097 of Yamamoto et al., a protective member is removably attached to an active surface of a wafer by a pressure-sensitive adhesive.

Wafer thinning is performed in order to (a) reduce the package size, (b) reduce the consumption of saw blades in subsequent die singulation from the wafer, and (c) remove any electrical junctions that have formed on the wafer back side during fabrication. The processes typically used for wafer thinning include mechanical grinding and chemical-mechanical polishing (CMP). Alternatively, etching may be used but is not generally preferred. Each of these processes requires protection of the front side or active surface of the wafer containing the electronic components of the semiconductor die and/or wafer. The wafer grinding/polishing step typically results in a somewhat rough back side, which is not conducive to other semiconductor die manufacturing processes, such as direct laser marking of a semiconductor die.

Although wafer thinning produces semiconductor dice of much reduced size, it also tends to result in a higher incidence of semiconductor die breakage. In addition, stresses induced by any grinding and polishing processes must be carefully controlled to prevent wafer and semiconductor die warping or bowing. Wafer warp interferes with precise semiconductor die separation (singulation), and semiconductor die warping results in die-attach problems in subsequent packaging. In addition, warping may cause breakage of wire bonds, etc.

Stresses produced in a semiconductor die by application of a layer thereto may be classified as either "intrinsic" or result from "thermal mismatch" between the material of the semiconductor die and the material of the applied layer. In the former case, the applied layer may be in tensile or compressive stress as applied or cured. For example, a polymeric layer may shrink during a curing step to produce intrinsic compressive stress in the active surface of a semiconductor die to which it is attached. Stress resulting from thermal mismatch is particularly evident where the layer deposition is not done at room temperature. Upon cooling to ambient temperature or to a working temperature, different coefficients of expansion (CTE) result in differential contraction or expansion between the semiconductor die substrate, the wafer, and the applied layer. Each of these stress components is important in the fabrication of semiconductor die, particularly where the ratio of semiconductor die thickness to semiconductor die length (or width) is very low.

Application of an effective passivation layer to the front side of a wafer typically results in stresses in the wafer and the semiconductor die singulated therefrom. Stresses introduced by the passivation layer may be sufficient to produce undesirable warping in the semiconductor dice, particularly where the wafer has been thinned to a high degree. A rigid unwarped substrate is particularly critical in forming known-good-die (KGD) with wire bonds.

In one sawing method of singulation, the wafer back side is attached to a flexible plastic film to hold the individual semiconductor die in place during cutting. The film is subsequently separated and removed from the singulated semiconductor die, and has no effect upon die warping. In one version, the film is stretched to release the semiconductor dice, which are then simply picked off the film. The semiconductor dice may then be processed to form differing types of semiconductor packages.

In one commonly used die-attach method, an adhesive material (e.g., epoxy) is used to join the back side of a die to a carrier. The adhesive material may be insulative or be electrically conductive and heat conductive.

Layer formation on a wafer back side has been done for another purpose. Such layers have been applied to provide a smooth surface for marking a semiconductor die or wafer with indicia identifying the manufacturer, serial number, lot number, and/or bar code, for example.

Conventional laser marking techniques utilize a very high intensity beam of light to alter the surface of a semiconductor die by melting, burning, or ablating the device surface directly, or by discoloration or decoloration of a laser reactive coating applied to a surface of the bare semiconductor die or packaged semiconductor die. The beam of light may be scanned over the surface of the bare or packaged semiconductor die in the requisite pattern, or can be directed through a mask, which projects the desired inscriptions onto the desired surface of the bare or packaged semiconductor die. The surface or coating of the semiconductor die thus modified, the laser marking creates a reflectivity difference from the rest of the surface of the semiconductor die.

Numerous methods for laser marking are known in the art. One method of laser marking involves applications where a laser beam is directed to contact the surface of a semiconductor device directly, as shown in U.S. Pat. Nos. 5,357,077 to Tsuruta, U.S. Pat. No. 5,329,090 to Woelki et al., U.S. Pat. No. 4,945,204 to Nakamura et al., U.S. Pat. No. 4,638,144 to Latta, Jr., U.S. Pat. No. 4,585,931 to Duncan et al., and U.S. Pat. No. 4,375,025 to Carlson.

Another method of laser marking makes use of various surface coating, e.g., carbon black and zinc borate, of a different color than the underlying device material. Two examples of this type of marking are described in U.S. Pat. Nos. 5,985,377 to Corbett and U.S. Pat. No. 4,707,722 to Folk et al.

In U.S. Pat. No. 5,866,644 to Mercx et al., molding compounds are disclosed, which form products that may be laser marked. The molding compound contains a pigment as well as glass fibers for reinforcing the molded object.

The above-indicated methods have been found to be inadequate for marking the back side of a wafer or semiconductor die, inasmuch as the thinning methods, including mechanical grinding, chemical mechanical polishing, and etching all leave the back side in a nonsmooth condition with a surface topography unsuited for laser marking (with or without a thin surface coating).

Moreover, none of the coatings, if applied to the back side of a wafer or semiconductor die, will balance wafer stress or semiconductor die stress to prevent or significantly reduce warp.

BRIEF SUMMARY OF THE INVENTION

The present invention provides a method for balancing stresses resulting from application of a passivation layer or other layer on the front side of a semiconductor wafer. The term "passivation layer" will be used herein to denote any front side layer (compressive or tensile), which creates stress in the singulated die tending to form warp. The method and apparatus have particular application to wafers or semiconductor die that have been subjected to a thinning process, including backgrinding in particular. The present method comprises application of a stress-balancing layer (SBL) on the opposite side from a stress-creating layer such as a photoresist passivation layer, for example. Thus, a passivation layer covering the circuitry of each semiconductor die of a wafer will typically introduce compressive stresses into the dice; a stress-balancing layer (SBL) that is applied after wafer thinning but before singulation will result in individual semiconductor die in which the front side stresses and back side stresses are balanced, preventing dice warp.

The stress-balancing layer may be formed of a rigid material that resists deformation. The stress-balancing layer may be formed to have mechanical properties similar to the passivation layer and be applied under similar conditions so that the stress it creates on the die back side will approximately equal the stress on the die front side. The composition and thickness of the SBL may be varied to provide the desired balancing stress forces.

The stress-balancing layer may be applied by various methods. In a preferred method, an SBL may be applied by a chemical vapor deposition (CVD), epitaxy or other process over portions or all of the wafer back side. In particular, various CVD processes permit a uniform layer of material to be accurately deposited. Other methods that may be used to form the SBL on the back side include various evaporation methods and molecular beam epitaxy (MBE), for example.

The stress-balancing layer may comprise a composite of two or more materials. For example, semiconductor die having large aspect ratios may have formed thereon a rigid composite SBL having different reinforcing properties in the X and Y directions. Alternatively, two or more materials may be sequentially formed on the thinned wafer back side as a multilayer composite. Preferably, however, the stress-balancing layer comprises a single layer of a matrix material containing distributed particles of a reinforcing component, which provide rigidity in the X-Y plane, and more preferably, in all directions. Careful selection of materials enables the SBL to be a very thin layer, which contributes little to the overall Y-dimension of a die. The stress-balancing layer of this invention is generally intended to be a permanent part of a semiconductor die. An exception to this rule is when a stress-causing layer requiring an SBL is subsequently removed or its stress causing effect otherwise ameliorated, in which case the SBL may optionally be removed. Inasmuch as the SBL is a very thin layer, and its removal would weaken the semiconductor die, it is generally considered to be a permanent part of the semiconductor die. Furthermore, the SBL may serve other purposes. For example, the SBL or adhesive applied thereto may comprise a laser-markable material for applying indicia to each individual semiconductor die, as discussed infra. Also, the SBL may itself comprise an adhesive material useful for bonding the die back side to a substrate, such as a circuit board.

In another aspect of the invention, an adhesive layer is applied to the highly planar stress-balancing layer for back side semiconductor die attachment to a package substrate, etc.

Application of the invention results in improved ease in the manufacture of semiconductor dice, with improved semiconductor die quality (planarity and wire bonds), and concomitant reduction in defective semiconductor die.

BRIEF DESCRIPTION OF THE SEVERAL VIEWS OF THE DRAWINGS

The nature of the present invention as well as other embodiments thereof may be more clearly understood by reference to the following detailed description of the invention, to the appended claims, and to the several drawings herein, wherein dimensions may be exaggerated for the sake of clarity, and wherein:

FIG. 1 is a schematic perspective view of a multidie semiconductor wafer that has been thinned and with visible die-separating streets;

FIG. 2A is a cross-sectional view of a semiconductor die with compressive stress applied thereto by a passivation layer on its front side to create die warp;

FIG. 2B is a cross-sectional view of a semiconductor die with tensile stress applied thereto by a passivation layer on its front side to create die warp;

FIGS. 3 through 10 are cross-sectional edge views of a portion of a semiconductor wafer during manufacturing processes to form semiconductor dice in accordance with the invention, wherein:

FIG. 3 is a cross-sectional view of a raw sliced wafer;

FIG. 4 is a cross-sectional view of a wafer following front side grinding and polishing;

FIG. 5 is a cross-sectional view of a wafer showing a plurality of representative electronic devices fabricated on the front side thereof;

FIG. 6 is a cross-sectional view of a wafer following deposition of a passivation layer over the electronic devices fabricated on the front side thereof;

FIG. 7 is a cross-sectional view of a wafer following back side thinning;

FIG. 8 is a cross-sectional view of a wafer following application of a stress-balancing layer on the thinned back side thereof;

FIG. 9 is a cross-sectional view of a wafer following curing of a stress-balancing layer on the thinned back side thereof;

FIG. 10 is a cross-sectional view of a semiconductor die following singulation of a wafer;

FIG. 17A is a side view of an exemplary semiconductor die formed in accordance with the invention, illustrating a balancing of compressive stress;

FIG. 17B is a side view of another exemplary semiconductor die formed in accordance with the invention, illustrating a balancing of tensile stress;

FIG. 18 is a view of the back side of exemplary portions of a semiconductor wafer to which three forms of a stress-balancing layer are applied in accordance with the invention.

DETAILED DESCRIPTION OF THE INVENTION

Figure 11:
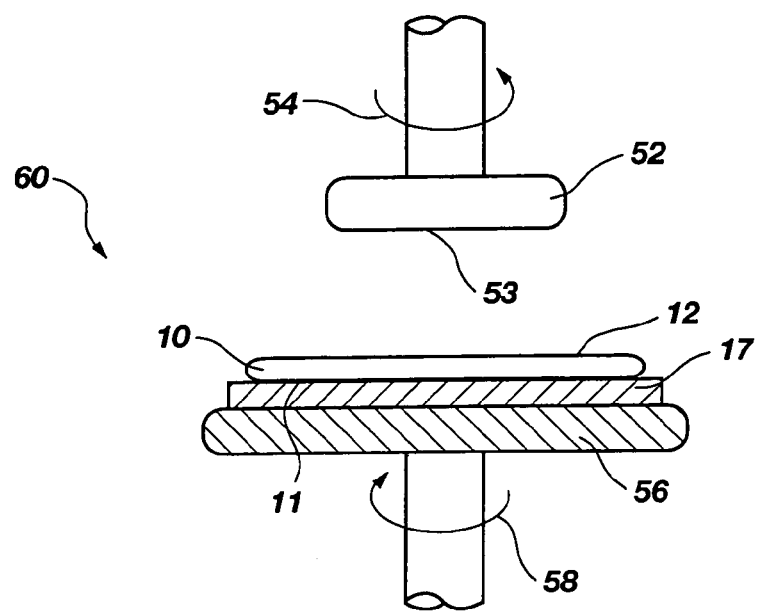
FIG. 11 is a simplified side view of a conventional back-grinding apparatus and semiconductor wafer mounted thereon.

The present invention relates to semiconductor dice 20 formed in a multidie wafer 10 as shown in FIG. 1. As depicted, wafer 10 is typically circular in shape with a circumferential edge 28. The circumferential edge 28 is shown with an optional upper beveled surface 38 for ease of handling without breakage. The wafer 10 may optionally be of another shape. Semiconductor dice 20 are configured with opposing major surfaces, front side or active surface 11 and back side 12. Electronic components, not shown in FIG. 1, are fabricated in the wafer 10 front side, i.e., active surface 11 and will be identified herein as integrated circuits. Each semiconductor die 20 of the wafer 10 is bounded by "streets" or saw lines 26 in both the X and Y directions and has an integrated circuit with bond pads thereon. The back side 12 of wafer 10 typically is free from circuitry. Following fabrication of the integrated circuits, a passivation layer 40A (FIG. 2A) of protective passivating material is typically applied to cover the circuitry and front side surfaces 11.

Turning now to FIG. 2A, a side cross-sectional view of a prior art semiconductor die 20A having a thickness 42 is shown with the passivation layer 40A having a thickness 44 joined to the front side 11. Some features are exaggerated for the sake of clarity. The passivation layer 40A is shown as having laterally "shrunk" relative to the semiconductor die 20A at the extant temperature, resulting in compressive lateral stress forces 16 acting at the die-layer interface 22. Reactive stress forces 18 in the semiconductor die 20A oppose the applied stress forces 16, and the stress forces 16, 18 result in what is denoted herein as compressive warp.

As shown in FIG. 2B, semiconductor die 20B of a prior art is shown with passivation layer 40B joined to the front side 11. The passivation layer 40B has laterally "expanded" relative to the semiconductor die 20B, creating tensile lateral stress forces 16 acting at the die-layer interface 22. Reactive stress forces 18 in semiconductor die 20B oppose the applied stress forces 16, and the result is what is denoted herein as tensile warp.

The degree of warp, whether compressive or tensile, depends upon the aspect ratio of the semiconductor die 20 and the active stress forces 16, 18. Minimization or elimination of die warp is important to the manufacture of a high quality die with a minimum number of defects.

FIGS. 3 through 10 illustrate one embodiment of the method useful for balancing stresses in semiconductor dice 20.

A portion of a semiconductor wafer 10 is depicted in FIG. 3 as comprising a wafer substrate 32. The wafer 10 has a front side 11, an opposing back side 12, and a circumferential edge 28. The wafer 10 is sliced from a crystalline cylinder of a semiconductive material such as silicon, germanium, gallium arsenide, etc., which comprises the wafer substrate 32.

As shown in FIG. 4, the front side 11 of the wafer 10 is ground and polished to a smooth surface, which becomes the active surface of each resulting semiconductor die 20. The portion 15 of the wafer substrate material removed from the wafer 10 reduces the wafer thickness 42. This planarization step is typically conducted by chemical-mechanical polishing (CMP).

The integrated microcircuits 30 are then fabricated in accordance with a pattern on the front side (active surface) 11 of the wafer's substrate 32. As shown in FIG. 5, each microcircuit 30 is associated with a semiconductor die 20 that will be singulated along streets 26 in a later step. The microcircuit 30 typically comprises various electronic components such as transistors, diodes, resistors, capacitors, insulators, conductors, and the like, as known in the art. Typically, a series of conductive "bond pads" on the active surface permit electrical connection of the microcircuit 30 to a circuit board, a testing machine, or to the microcircuit of another die or dice. Each microcircuit 30 is configured to provide a desired electronic result in a very small space.

Referring now to FIG. 6, it is seen that an electrically insulative passivation layer 40 is typically applied to cover the microcircuit 30 following circuit fabrication. The passivation layer 40 protects the microcircuit 30 from damage during subsequent manufacturing steps as well as in ultimate use.

Unprotected, the microcircuit 30 may be degraded by contamination, chemical action, corrosion, and/or handling. Passivation layer 40 may comprise any of a variety of materials, including silicon dioxide and silicon nitride as examples. Such materials are typically applied by a chemical vapor deposition (CVP) process at elevated temperature. Thus, a difference in coefficient of thermal expansion (CTE) between the passivation layer 40 and the die material to which it is applied will result in a residual stress in the wafer 10, and in semiconductor dice 20 when the wafer 10 is diced (die singulation). For example, silicon has a CTE that is several times the CTE of silicon dioxide and will contract much more than a silicon dioxide passivation layer upon cooling from an elevated temperature, creating stress that is concentrated at the die-layer interface 22 between the wafer 10 and the passivation layer 40.

As depicted in FIG. 7, the back side 12 of the wafer 10 is then ground to reduce the wafer thickness 42 of the wafer substrate 32. In a conventional backgrinding process, illustrated in FIG. 11, a grinding wheel 52 with grinding surface 53 grinds away a portion 25 (see FIG. 7) of semiconductor wafer substrate 32 from the back side 12. Such grinding to fully thin the wafer thickness 42 typically leaves a somewhat nonsmooth ground surface 24 with grooves and/or swirls present. However, the unevenness makes the ground surface 24 conducive to later adhesive attachment of a stress-balancing layer 50 (FIG. 8) thereto.

As shown by the arrows in FIG. 11, grinding wheel 52 of backgrinding apparatus 60 typically rotates in one direction 54 while a platen 56 providing physical support for semiconductor wafer 10 rotates in another direction 58. This results in the grinding pattern referred to above, which tends to vary from one side of wafer 10 as opposed to the other. A submount 17, formed of tape, wax, molding compound, etc., typically provides protection for the active surface 11 of the unsingulated semiconductor die 20 formed on semiconductor wafer 10 as well as structural support during the thinning process.

Turning now to FIG. 8, in accordance with this invention, a stress-balancing layer (SBL) 50 is applied to the ground surface 24 to balance the stress created by the passivation layer 40 in the wafer substrate 32. The SBL 50 is configured to adhere tightly to the ground surface 24 and to oppose warping stresses in the wafer 10 as well as in the subsequently singulated semiconductor die 20.

The stress-balancing layer 50 may be formed in a variety of ways. For example, the SBL 50 may comprise a single rigid layer or a multifilm layer with each layer formed to resist deformation in a different direction, or with different deformation properties. In another form, homogeneously distributed inorganic particles may be bound in a matrix for uniform stress resistance in an X-Y plane, or optionally, omnidirectional. The stress-balancing layer 50 may be formed of any material or materials, which when applied in a thin layer to the back side semiconductor die ground surface 24, will provide a rigid structure resistant to warping of the semiconductor die 20.

In the event that the stress-balancing layer 50 requires a curing step to fully harden the layer, it is conducted, typically by exposure to heat or radiation (see FIG. 9).

Figure 12:
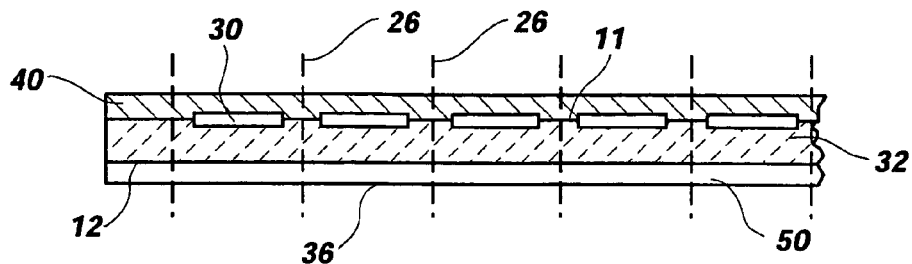
FIG. 12 is a cross-sectional view of a wafer of the invention wherein an applied stress-balancing layer comprises a single component or a homogeneous mixture of more than one component.

As shown in FIG. 12, an exemplary SBL 50 is shown as a single-component highly rigid layer such as, for example, a metal, alloy, metalorganic material, a photo-resist material or other material with the proper load-bearing characteristics.

Figure 13:
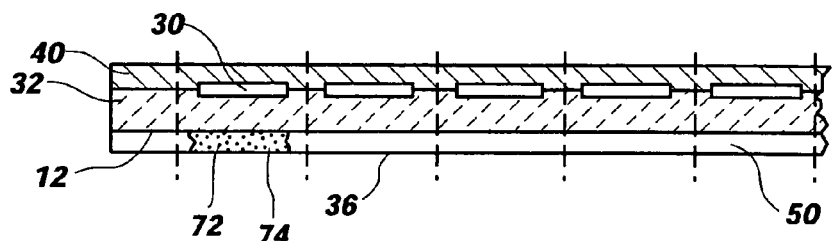
FIG. 13 is a cross-sectional view of a wafer of the invention wherein an applied stress-balancing layer comprises a heterogeneous mixture of a reinforcing material in a matrix base material.

In FIG. 13, SBL 50 is shown as a heterogeneous composite structure comprising uniformly distributed strong particles in a matrix material 74. For example, very small particles of reinforcing material 72 such as metal, glass, etc., may be distributed in a matrix material of silicon oxide, silicon nitride or a polymeric material.

Figure 14:
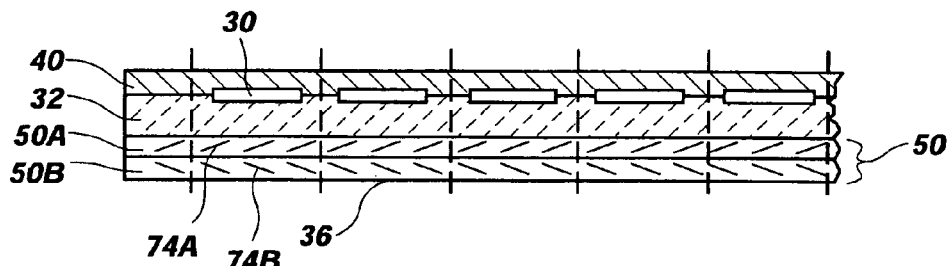
FIG. 14 is a cross-sectional view of a wafer of the invention wherein an applied stress-balancing layer comprises two separately applied sub-layers having reinforcement properties in different directions.

In a further embodiment shown in FIG. 14, two or more layers of composite materials (depicted as 50A and 50B) are sequentially deposited as a stress-balancing layer 50. Each layer is shown with a reinforcing material 74A or 74B configured to resist stresses (i.e., have highest rigidity) in a particular direction, so that the layer combination provides the desired warping resistance.

Various methods may be used to deposit the materials forming the SBL 50. For example, the SBL 50 may be formed by an epitaxy process such as vapor phase epitaxy (VPE), molecular beam epitaxy (MBE), or complementary field effect transistor epitaxy (CMOSE). Sputtering and other methods may be used including physical vapor deposition (PVD). Preferably, a chemical vapor deposition (CVD) method is used. Various CVD methods include low pressure chemical vapor deposition (LPCVD), atmospheric pressure chemical vapor deposition (APCVD), metal-organic chemical vapor deposition (MOCVD), plasma-enhanced chemical vapor deposition (PECVD), and ultra-high vacuum chemical vapor deposition (UHVCVD), any of which may be used to produce a particular stress-balancing layer 50.

The SBL 50 may itself comprise an adhesive material, particularly when combined with added reinforcement particles. For example, polymeric materials known in the art may be applied to form a rigid structure, yet retain adhesive properties. Thus, semiconductor dice 20 formed therefrom may be adhesively attached to a circuit board or other substrate.

Figure 15:
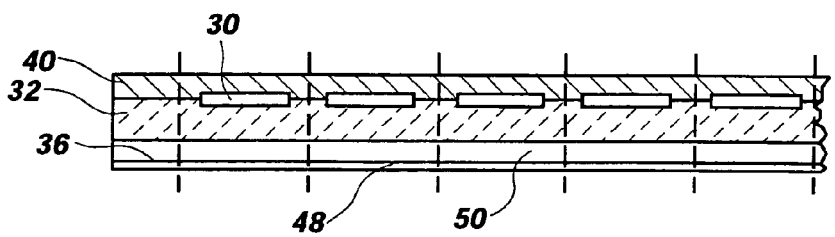
FIG. 15 is a cross-sectional view of a wafer following applying an adhesive layer to a stress-balancing layer on the thinned back side.
Figure 16:
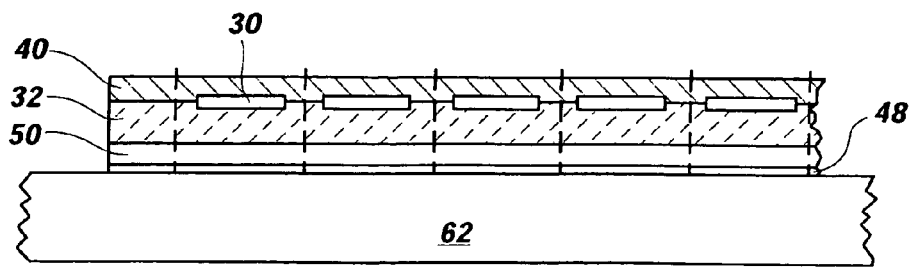
FIG. 16 is a cross-sectional view of wafer following attaching a carrier member to the stress-balancing layer in accordance with the invention.

In an alternative embodiment of the present invention, an adhesive layer 48 may be applied to the stress-balancing layer 50, as depicted in FIG. 15. The adhesive layer 48 may be formed of a type of adhesive material characterized as being epoxy, or other suitable adhesive material. This adhesive layer 48 may be used as a die attach adhesive, or may be used to temporarily attach a carrier tape 62 to the wafer 10, as in FIG. 16. As discussed, infra, the adhesive layer 48 may also comprise a markable material such as a UV acrylic, thiophene, poly-paraxylylene (Paralene), urethanes, silicones, and acrylics, provided its strength is sufficient to resist die warping. Carrier tapes 62 are generally used to protect and hold the semiconductor dice 20 in place during sawing of the wafer 10 and enable convenient pick-off of individual semiconductor die 20 for transfer to a substrate in a semiconductor die 20 attach step.

Another embodiment of the invention utilizes a tape as a stress-balancing layer 50, wherein stresses in the plane of the tape are resisted by rigidity. The tape may be monolayer or multilayer and may be formed of or include a metal film. It is important to utilize an adhesive that will rigidly adhere to the tape and semiconductor die 20 as a very thin film. The tape may be thinly adhesed on both sides, for temporary attachment to a carrier tape 62 or for permanent semiconductor die attach to a circuit board or other substrate, not shown in the figures.

Whether the stress-balancing layer 50 is applied as a tape or as a CVD layer, it may be applied to overcover the entire thinned ground surface 24, or alternatively cover selected portions of the wafer 10 or of each semiconductor die 20. For example, as shown in FIG. 18, an SBL 50 may be applied in various patterns of stress-balancing layers 50X, 50Y and 50Z on the thinned semiconductor die back side 12 of each semiconductor die 20 of a wafer 10. As shown in these examples, stress-balancing layer 50X is configured to cover the entire back side 12 as a contiguous layer. In another embodiment, the stress-balancing layer 50Y may be patterned, for example, as a continuous longitudinal strip extending over a row of semiconductor dice 20. In a further variation, stress-balancing layer 50Z is shown as a discrete covering for each individual semiconductor die 20. The SBL 50Z is shown as comprising a rectangular covering over a majority of a semiconductor die back side 12. However, it may comprise any pattern 68 that achieves the desired stress balancing. If applied as a tape, stress-balancing layer 50 may be applied by an automated process such that the tape is in a highly regular and standard pattern corresponding to placement on predetermined specific areas on the semiconductor dice 20, or on wafer areas, which will correspond to individual semiconductor dice after singulation. As such, vision systems for reading marks on semiconductor dice can be adjusted to scan the desired marked areas. In the view of FIG. 18, an outer surface 36 of the stress-balancing layers 50X, 50Y or 50Z is uniformly planar for subsequent semiconductor die attach.

Although the stress-balancing layer 50 may be sometimes usefully applied to already singulated semiconductor die 20, it is preferred to apply stress-balancing layer 50 to the wafer ground surface 24 prior to singulation, because this avoids warpage resulting from singulation and is generally more cost-effective.

Exemplary semiconductor dice 20C and 20D formed by the method of the invention are illustrated in FIGS. 17A and 17B. As illustrated in FIGS. 17A and 17B, a stress-balancing layer 50C or 50D is applied to the back side 12 of a semiconductor die 20C, 20D, respectively. This stress-balancing layer 50C or 50D balances reactive stress forces 18 in semiconductor die 20C or 20D caused by compressive or tensile stress forces 16 in passivation layers 40C and 40D, and maintain the semiconductor dice in a generally warp-free condition. The Counter forces 70 in the SBL 50C, 50D balance the warping stress forces 16 in the passivation layers 40C, 40D.

Figure 19:
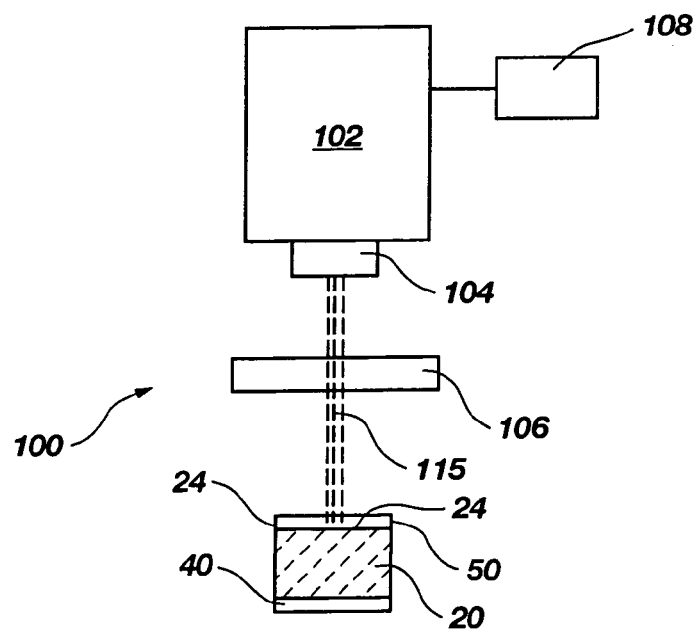
FIG. 19 is a simplified schematic view of a conventional laser marking system.

The SBL 50 is particularly useful when it, or an adhesive layer 48 applied thereto, is configured to be used as an indicia marking layer. FIG. 19 illustrates in a simplified schematic view of a conventional laser marking system 100 capable of readily marking semiconductor dice 20 to which a laser-markable material has been applied. The system 100 comprises a laser 102, a lens system 104, a shadow mask 106 and a laser control system 108 for monitoring and controlling the function of the apparatus. For purposes of this invention, a "laser" is considered to be any optical energy source capable of marking a surface of a stress-balancing layer 50 through the use of light energy and/or heat. Preferably, laser 102 is comprised of an Nd:YAG (yttrium aluminum garnet), Nd:YLP (pulsed yttrium fiber laser), carbon dioxide, or other suitable optical energy devices known in the art. It is understood, however, that laser 102 may also comprise an ultraviolet (UV) energy source or other energy beam. When laser 102 is energized, an intense beam of light 115 is projected from lens system 104 through shadow mask 106 onto the surface of the laser-markable material (SBL 50 or adhesive layer 48 applied thereto). When laser beam 115 impinges on laser-markable material SBL 50 or adhesive layer 48, the material in, on, embedded in, attached to or under the material is altered, e.g., by heating, vaporization, burning, melting, chemical reaction, residue or dye transfer, or combinations thereof. The result comprises a color or texture change, or both, having an image of shadow mask 106 appearing on the ground surface 24 of the semiconductor die 20. Although a shadow mask 106 is shown in this embodiment, the present invention contemplates computer-directed operation, including mechanical movement of laser 102 in conjunction with, or without, shadow mask 106.

The stress-balancing layer 50 may advantageously be formed of a material that also has antistatic properties.

The present invention is applicable to semiconductor dice of any electronic or physical configuration, in which stresses tending to warp the semiconductor dice are present. Thus, for example, the semiconductor die may be one of a DIP, SIP, ZIP, PLCC, SOJ, SIMM, DIMM, LCC, QFP, SOP, TSOP, flip-chip, etc.

Thus, in the present invention, a stress-balancing layer 50 may be formed on the ground surface 24 of a semiconductor wafer 10 to balance warping stresses in the subsequently singulated semiconductor dice 20. In addition, the stress-balancing layer 50 may be configured to be or support a markable layer on the die's thinned ground surface 24. The stress-balancing layer 50 may also be configured to comprise or support a semiconductor die attach adhesive or carrier adhesive.

The stress-balancing layer 50, which is applied to the back side 12, and ground surface 24 of a thinned wafer 10 may comprise only a very small portion in the Z direction of the subsequently singulated dice. The wafer thickness 42 of the SBL 50 will depend upon the footprint size and thickness of the die and will generally be larger as the footprint increases. Typically, for the stresses normally encountered in small semiconductor dice 20, i.e., less than about 10 mm in the X and Y directions and less than about 1.5 mm in the Z direction, the wafer thickness 42 of the SBL 50 is generally less than about 0.1 mm and effectively prevents or counteracts the tendency to warp. The SBL 50 may be formed of the same material as the stress-causing passivation layer 40 and be of a similar wafer thickness 42.

While the present invention has been disclosed herein in terms of certain exemplary embodiments, those of ordinary skill in the art will recognize and appreciate that it is not so limited. Various combinations or modifications to the disclosed embodiments may be effected without departing from the scope of the invention. Moreover, features from one embodiment may be combined with features from other embodiments.

For example, this invention, while being described with reference to semiconductor wafers containing integrated circuits and individual semiconductor dice, has equal utility to any type of substrate in which compressive or tensile stresses require balancing. Furthermore, the invention finds added utility where two or more of stress balancing, marking, adhesion, and surface protection of a substrate are desired to be simultaneously achieved. The scope of the instant invention is only to be limited by the claims that follow and equivalents thereof.

What is claimed is:

1. A manufacturing method for a wafer comprising:
   grinding a front side of the wafer formed of semiconductor material comprising one of silicon, germanium, and gallium arsenide;
   forming a plurality of circuits forming individual semiconductor devices on one side of the wafer;
   applying a passivation layer over the plurality of circuits formed on the one side of the wafer;
   reducing a cross-section of the wafer by thinning material from a another side of the wafer;
   applying a stress-balancing layer to the another side of the wafer balancing the stress caused by the plurality of circuits on the one side of the wafer; and
   singulating the wafer into at least one semiconductor die.

2. The method of claim 1, wherein the stress-balancing layer comprises a layer applied in fabrication of the at least one semiconductor die.

3. The method of claim 1, wherein the stress-balancing layer comprises a layer of passivation material.

4. The method of claim 1, wherein the reducing comprises grinding.

5. The method of claim 1, wherein the reducing comprises a chemical-mechanical method.

6. The method of claim 1, wherein the at least one semiconductor die comprises an integrated circuit semiconductor die.

7. The method of claim 1, wherein the stress-balancing layer comprises a strip covering a selected portion of a row of semiconductor dice on the wafer.

8. The method of claim 1, wherein the stress-balancing layer comprises a plurality of portions, each portion of the plurality of portions covering a selected portion of semiconductor dice on the wafer.

9. The method of claim 1, wherein a selected portion comprises a majority of the semiconductor dice.

10. The method of claim 1, wherein the stress-balancing layer comprises a heterogeneous composite structure comprising reinforcing particles in a solid matrix material.

11. The method of claim 10, wherein the reinforcing particles comprise inorganic particles.

12. The method of claim 10, wherein the reinforcing particles comprise one of a metal, an alloy, glass, and a combination thereof.

13. The method of with claim 10, wherein the reinforcing particles comprise particles for providing reinforcement in the X-Y plane of the stress-balancing layer.

14. The method of claim 10, wherein the reinforcing particles comprise particles for providing reinforcement in the X, Y, and Z directions.

15. The method of claim 10, wherein the solid matrix material comprises at least one material of silicon dioxide, silicon nitride, and an organic polymeric material.

16. The method of claim 1, wherein the at least one semiconductor die comprises one of a DIP, SIP, ZIP, PLCC, SOJ, SIMM, DJMM, LOC, QFP, SOP, TSOP, and a flip-chip.

17. The method of claim 1, wherein the stress-balancing layer comprises a material markable with indicia.

18. The method of claim 1, wherein the stress-balancing layer comprises a material markable by optical radiation energy.

19. The method of claim 1, wherein the stress-balancing layer comprises a polytetrafluoroethylene tape.

20. The method of claim 18, further comprising exposing at least a portion of the material markable with optical radiation energy to one of a Nd:YAG (yttrium aluminum garnet), Nd:YLP (pulsed yttrium fiber laser) or carbon dioxide laser for forming an indicia on the backside of the wafer.

21. A stress compensation method comprising:
grinding a front side of a wafer formed of semiconductor material comprising one of silicon, germanium, and gallium arsenide;
forming a plurality of circuits forming individual semiconductor devices on the front side of the wafer;
applying a passivation layer over the plurality of circuits formed on the front side of the wafer;
reducing a cross-section of a wafer by thinning a back side thereof;
applying a rigid stress-balancing layer to a portion of the thinned back side comprising a material for marking with indicia and for balancing stress caused by the passivation layer over the plurality of circuits;
exposing a portion of the semiconductor material to optical energy using one of a Nd:YAG (yttrium aluminum garnet), Nd:YLP (pulsed yttrium fiber laser) and carbon dioxide laser marking portions of a semiconductor die of the wafer on the back side thereof; and
singulating the wafer into at least one semiconductor die.

22. A force balancing method comprising:
placing a wafer of semiconductor material on a grinding apparatus;
grinding a front side of the wafer;
forming a plurality of circuits forming individual semiconductor devices on the front side of the wafer;
reducing a cross-section of a wafer by thinning a back side thereof;
applying a rigid stress-balancing layer comprising a material for marking with indicia to a portion of the thinned back side;
exposing a portion of the material to optical energy using one of a Nd:YAG (yttrium aluminum garnet), Nd:YLP (pulsed yttrium fiber laser) or carbon dioxide laser to mark portions of at least one semiconductor die of the wafer on the back side thereof with an indicia thereon by a portion of the material changing one of color or texture; and
singulating the wafer into at least one semiconductor die.

23. A planarization method for a semiconductor die comprising:
slicing a semiconductor ingot to form a semiconductor wafer;
grinding a front side of the wafer;
forming a plurality of circuits forming individual semiconductor devices on the front side of the wafer;
reducing a cross-section of a wafer by thinning material from a back side of the wafer;
applying a stress-balancing layer to the back side of the wafer for substantially balancing the stress caused by the plurality of circuits on the front side of the wafer and for creating a marking indicia on the other side of the wafer from one of a color change or texture change of the stress-balancing layer;
and
singulating the wafer into at least one semiconductor die.

* * * * *

UNITED STATES PATENT AND TRADEMARK OFFICE
CERTIFICATE OF CORRECTION

PATENT NO. : 7,727,785 B2 Page 1 of 1
APPLICATION NO. : 11/269069
DATED : June 1, 2010
INVENTOR(S) : Michael E. Connell et al.

It is certified that error appears in the above-identified patent and that said Letters Patent is hereby corrected as shown below:

In column 10, line 60, in Claim 1, after "from" delete "a".

In column 11, line 27, in Claim 13, after "method of" delete "with".

In column 11, line 38, in Claim 16, delete "DJMM," and insert -- DIMM, --, therefor.

Signed and Sealed this

Twenty-fourth Day of August, 2010

David J. Kappos
*Director of the United States Patent and Trademark Office*